US006888714B2

(12) United States Patent
Shaw et al.

(10) Patent No.: US 6,888,714 B2
(45) Date of Patent: May 3, 2005

(54) TUNEABLE FERROELECTRIC DECOUPLING CAPACITOR

(75) Inventors: Thomas M. Shaw, Peekskill, NY (US); W. David Pricer, Charlotte, VT (US); Deborah A. Neumayer, Danbury, CT (US); John D. Baniecki, New York, NY (US); Robert B. Laibowitz, Cortlandt Manor, NY (US)

(73) Assignee: International Business Machines Corporation, Armonk, NY (US)

( * ) Notice: Subject to any disclaimer, the term of this patent is extended or adjusted under 35 U.S.C. 154(b) by 146 days.

(21) Appl. No.: 10/305,767

(22) Filed: Nov. 27, 2002

(65) Prior Publication Data

US 2003/0112578 A1 Jun. 19, 2003

Related U.S. Application Data

(62) Division of application No. 09/430,901, filed on Nov. 1, 1999, now Pat. No. 6,507,476.

(51) Int. Cl.[7] .................................................. H01G 4/00
(52) U.S. Cl. .................... 361/301.2; 257/531; 257/533; 361/306.1; 361/306.3
(58) Field of Search ................................. 257/531, 533, 257/298, 503, 528; 361/301.2, 306.1, 306.3, 303, 306.2; 438/239, 240, 381

(56) References Cited

U.S. PATENT DOCUMENTS

| 4,785,202 | A | * | 11/1988 | Toyoda ........................ 326/101 |
| 4,931,897 | A | | 6/1990 | Tsukamoto et al. .......... 361/313 |
| 5,173,835 | A | | 12/1992 | Cornett et al. ............... 257/310 |
| 5,185,689 | A | | 2/1993 | Maniar ........................ 361/313 |
| 5,449,948 | A | * | 9/1995 | Inoue et al. ................. 257/531 |
| 5,563,762 | A | | 10/1996 | Leung et al. ............. 361/301.4 |
| 5,608,246 | A | | 3/1997 | Yeager et al. ................ 257/295 |
| 5,612,560 | A | | 3/1997 | Chivukula et al. ........... 257/309 |
| 5,789,303 | A | * | 8/1998 | Leung et al. ................. 438/381 |
| 5,818,079 | A | | 10/1998 | Noma et al. ................. 257/295 |
| 5,969,935 | A | | 10/1999 | Kammerdiner et al. ..... 361/311 |
| 6,266,227 | B1 | * | 7/2001 | Konushi et al. .......... 361/306.1 |
| 6,407,904 | B1 | * | 6/2002 | Kuroda et al. ............... 361/303 |
| 6,445,564 | B1 | * | 9/2002 | Naitoh ..................... 361/301.2 |
| 6,573,584 | B1 | * | 6/2003 | Nagakari et al. ............ 257/528 |

* cited by examiner

Primary Examiner—David Nelms
Assistant Examiner—Dao H. Nguyen
(74) Attorney, Agent, or Firm—Robert A. Walsh

(57) ABSTRACT

A voltage supply bypass capacitor for use with a semiconductor integrated circuit chip or module comprising a ferroelectric dielectric having electromechanical properties designed to provide maximum losses at selected frequencies.

13 Claims, 3 Drawing Sheets

TUNEABLE FERROELECTRIC DECOUPLING CAPACITOR

This application is a division of application Ser. No. 09/430,901, filed Nov. 1, 1999, which is now U.S. Pat. No. 6,507,476

BACKGROUND

High performance integrated circuit chips such as microprocessors require large values of bypass capacitance located closely adjacent to the chip. In some recent designs, such as the Digital Equipment Corporation Alpha 600 MHz microprocessor, it has been necessary to wirebond the bypass capacitor directly to the chip. In this particular example, the "bypass capacitor" is itself a specialized P channel FET chip with a large thin oxide region. Capacitor values are typically 10 nanofarads or more. Practical values of inductance range from a fraction of a nanohenry to a few nanohenrys. A simple calculation shows that such circuit combinations lead to resonant frequencies very close to the clock frequency of the microprocessor. The microprocessor clock itself contains many harmonics of the basic clock frequency. Specific repetitive operations of the microprocessor are capable of generating still other harmonics and subharmonics. Thus, it becomes nearly impossible to escape harmonics or subharmonics that can excite the resonant frequency of the bypass capacitor and its ancillary inductance. Adding resistance to the inductance to provide critical damping, destroys the efficacy of the bypass capacitor.

Accordingly, a voltage supply bypass capacitor is needed for high performance integrated circuit chips which can be designed to provide maximum losses at selected frequencies.

SUMMARY OF THE INVENTION

Now, an improved bypass capacitor has been developed for attachment to a semiconductor integrated circuit chip or module, which can be designed with mechanical dimensions or by electrical bias to provide maximum losses at selected frequencies. The capacitor can be engineered to provide maximum damping at the resonant frequency of the bypass network, the clock frequency of the semiconductor integrated circuit (IC) chip, or some multiple or submultiple of the clock frequency of the IC chip.

Ferroelectric materials are known to have dielectric constants of 1000 times or more that of silicon dioxide. Furthermore they can also be fabricated by integrated circuit like processing. These two properties alone make them attractive candidates for forming small chip-like structures which can be bonded to the microprocessor or other high performance integrated circuit.

However, lesser known and appreciated are the electrostrictive properties of ferroelectric materials. Ferroelectrics attain high dielectric constants because certain atoms within the crystalline structure move atomic distances in response to an electric field. As a corollary action, the crystal also deforms under the same electric field. Ferroelectrics can also exhibit a hysteresis loop, indicating that these materials can be made lossy.

According to the present invention, it has been discovered that ferroelectric dielectric capacitors can be fabricated using mechanical dimensions to design the ferroelectric dielectric capacitors to be lossy at desired design frequencies. These losses are not present at DC where they would represent a severe power problem; and, further, these losses do not affect the efficacy of the ferroelectric dielectric capacitor to serve as a bypass capacitor to smooth out power surges instigated by a semiconductor integrated circuit chip such as a microprocessor or other high performance integrated circuit chip.

Ferroelectrics exhibit mechanical resonances when an AC field is applied due to their electrostrictive behavior. These resonances result in an increase in electrical loss at the mechanical resonance frequency. Thus, a loss peak in a ferroelectric capacitor can be tuned to a specific frequency by changing the mechanical resonances of the capacitor structure. In capacitors prepared from bulk material, resonances in the MHz range can be achieved. In thin film capacitors, the resonance frequency can be extended into the GHz range.

BRIEF DESCRIPTION OF THE DRAWINGS

For a further understanding of the nature of the present invention, as well as other features and advantages thereof, reference should be made to the following detailed description taken in conjunction with the accompanying drawings wherein.

DETAILED DESCRIPTION

Figure 1:
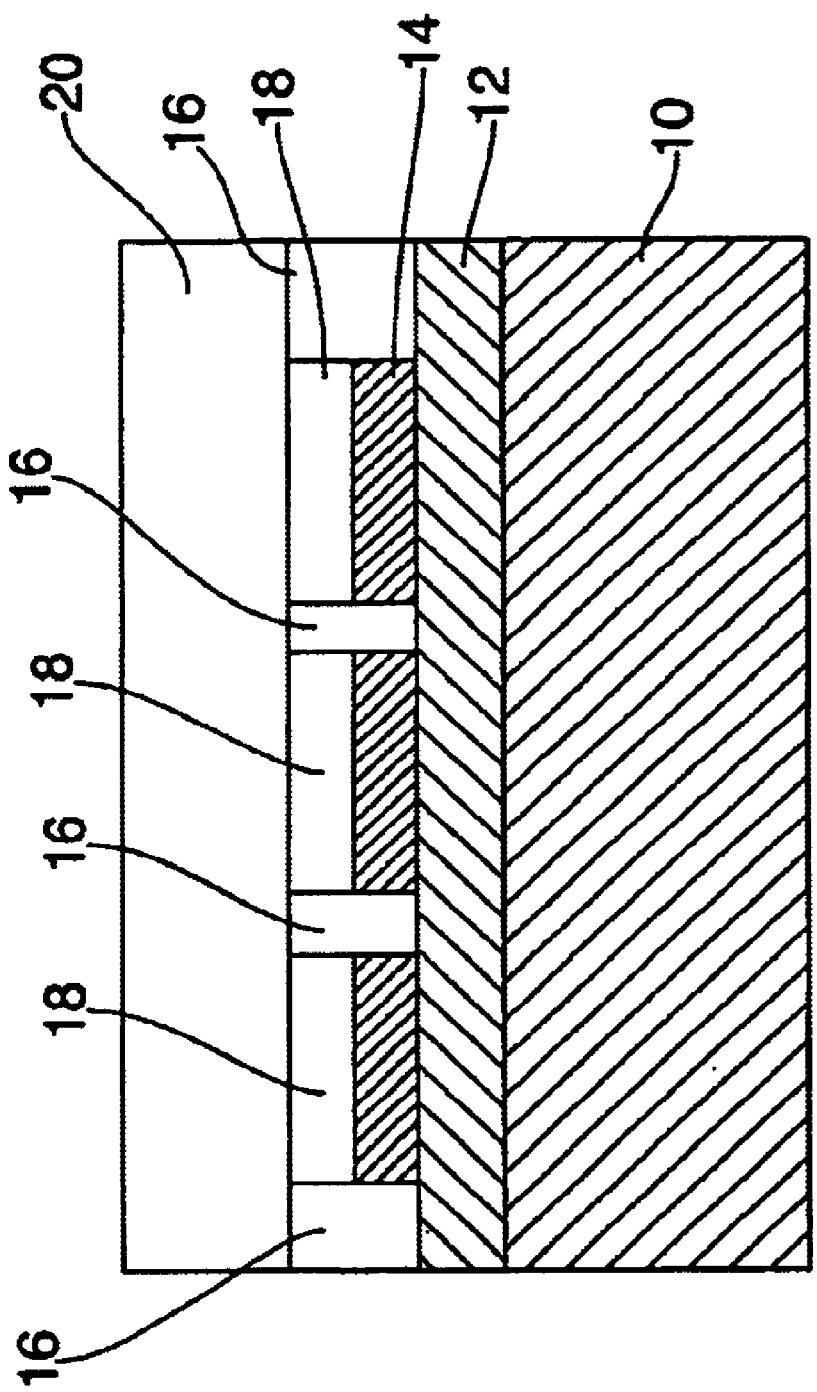
FIG. 1 is a simplified, magnified, cross-sectional view depicting a capacitor array structure according to the present invention.

By changing the dimensions of a capacitor (thickness (D) and area (A) dimensions) the resonances can be shifted over a wide frequency range. This tuneability allows one to make a decoupling capacitor that has damping peaked at the harmonics of an integrated processor. The damping may be maximized by selecting ferroelectrics that have enhanced electromechanical coupling. Such preferred materials include perovskite type oxides having the formula $ABO_3$ wherein B is at least one acid oxide containing a metal selected from the group consisting of: Ti, Zr, Hf, V, Nb, Ta, Cr, Mo, W, Cu, and Al, and A is at least one additional cation having a positive formal charge of from about 1 to about 3. Examples include perovskite type oxides selected from: a titanate system material such as lead titanate, lead zirconate titanate, lead lanthanum zirconate titanate, barium titanate, barium strontium titanate, barium lanthanum titanate, a niobate or tantalate system material such as lead magnesium niobate, lithium niobate lithium tantalate, potassium niobate and potassium tantalum niobate, a tungsten-bronze system material such as barium strontium niobate, lead barium niobate, barium titanium niobate, and Bi-layered perovskite system material such as strontium bismuth tantalate, bismuth titanate and the like materials such as lead zirconium titanates and lead lanthanum zirconium titanates, or other compositions that have large piezoelectric coefficients are preferred.

The damping may be further enhanced by embedding the capacitors in a medium that has a high mechanical loss such as a polymer. The magnitude of the loss can also be tuned by changing the voltage of operation of the capacitor. At applied fields close to the cohercive field of the ferroelectric, damping is minimized. By increasing the voltage above or below the cohercive field, the amount of damping can be selectively increased. In order to obtain sufficient capacitance, the capacitor may comprise an array of tuned capacitors. An array of capacitors may be connected in parallel in which each capacitor in the array is tuned to a single frequency, and the number of capacitors in the array is chosen to give a specific capacitance. Also by combining capacitors of different sizes in the same array, multiple loss peaks at different frequencies may be achieved.

The metal oxide ferroelectric materials such as strontium bismuth tantalate, lead zirconate titanate, and bismuth titanate require processing temperatures greater than 500° C. in strongly oxidizing environments. For example, strontium bismuth tantalate typically requires anneals at 800° C. of 30 minutes or more. Under such extreme processing conditions, the electrode stack of a typical device for the ferroelectric material exhibits severe instability and sub-layer interaction problems, oxidation of the underlying structures is probable, as is unwanted diffusion of dopants. In addition, metal oxide ferroelectrics are known to degrade during plasma processing and forming gas anneals. This degradation has been shown to be recovered by an oxygen recovery anneal. By forming a discrete chip capacitor, the problems listed above can be avoided or minimized. By using a discrete chip capacitor, the oxidation of underlying structures and unwanted diffusion problems in the integrated circuit are no longer applicable. In addition, subsequent plasma processing steps may no longer be necessary which may degrade the ferroelectric properties and a recovery anneal in oxygen may be feasible because it would not affect the integrated circuit.

Referring to FIG. 1, a tuneable capacitor array structure according to the present invention is shown comprising a semiconductor substrate 10, such as silicon, upon which a first layer of conducting material 12, such as platinum, is deposited. A layer of ferroelectric material 14, preferably having a large piezoelectric coefficient, such as a lead zirconium titanate, then is deposited on the first layer of conducting material 12. The layer of ferroelectric material 14 is separated by dielectric barriers 16, and a second layer of conducting material 18, such as platinum, is deposited on the layer of ferroelectric material 14 to complete the capacitor stack. Contact layer 20 is provided for interconnection.

The following examples are provided to further describe the invention. The examples are intended to be illustrative and are not to be construed as limiting the scope of the invention.

EXAMPLE 1

This example illustrates a 4 micrometer by 4 micrometer ferroelectric capacitor prepared on an oxidized silicon wafer. An oxide layer 400 nm thick was deposited on a silicon wafer. A blanket layer 250 nm thick of platinum was sputtered on the wafer and patterned by standard photolithiographic techniques to form a bottom electrode for the capacitor and a contact pad for electrical testing. A thin film consisting of Strontium Bismuth Tantalate (SBT)/Bismuth Titanate (BT) ferroelectric layers was spun onto the wafer by chemical solution deposition technique. The film consisted of three layers SBT and one layer of BT and has a total thickness of 120 nm. A blanket film 100 nm thick of Pt was deposited on top of the film and patterned to form the top capacitor electrode and electrical contact.

Figure 2:
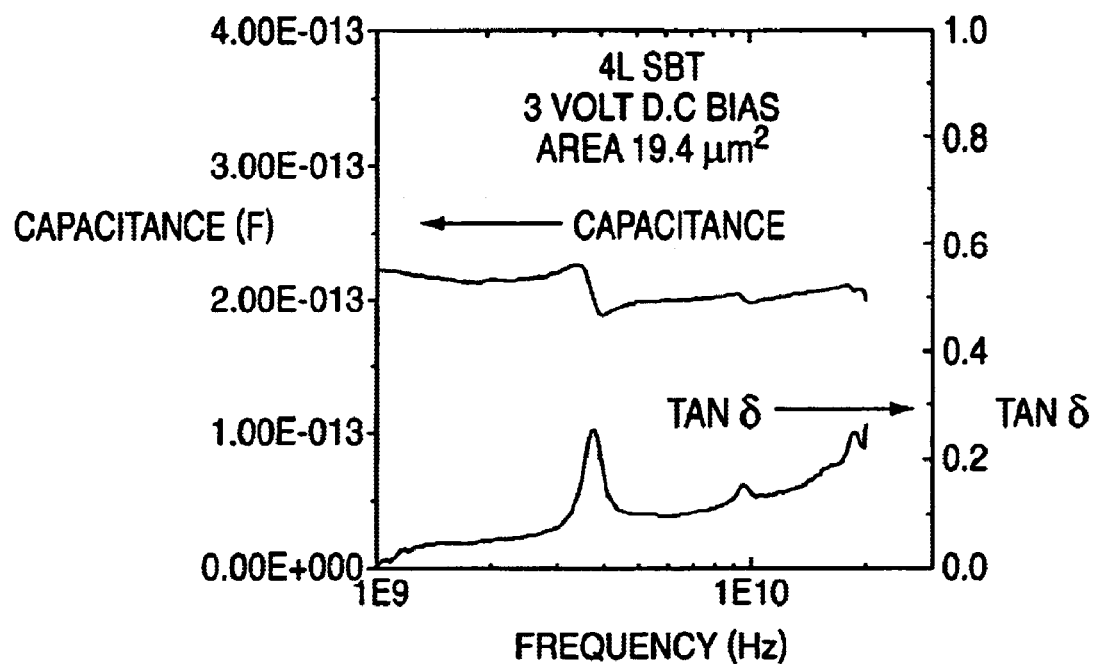
FIG. 2 and FIG. 3 show plots of capacitance and Tan δ vs frequency.

Measurements made using a Radiant Technologies ferroelectric test system confirmed that the film was ferroelectric. High frequency electrical testing was conducted using a Hewlett Packard 8720 vector network analyzer. Contact to the capacitor was made using a cascade high frequency probe. Parasitics were corrected for using open and shorted test structures. The real and imaginary parts of the capacitor were measured over the frequency range 1–20 GHz and are shown in FIG. 2 as a plot of capacitance and Tan δ vs frequency.

As shown in the graph, the capacitor has resonances at 3.76 GHz and 9.5 GHz producing sharp peaks in the loss of the capacitor.

Figure 3:
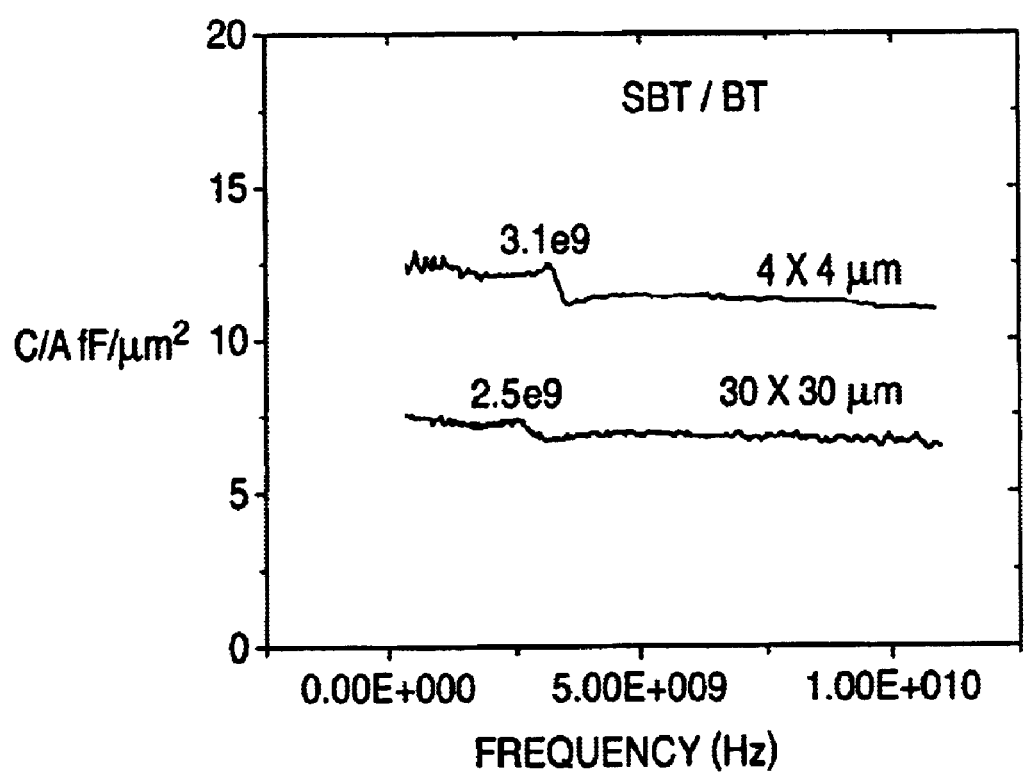

Data from testing two capacitors prepared as described above but with two different dimensions (4×4 nm and 30×30 nm) are shown in FIG. 3.

In these capacitors, resonances are seen at 3.1 GHz and 2.5 GHz. Thus, it is illustrated that by changing the size of the capacitor the position of the loss peak can be tuned to a particular frequency. In this example the frequency of the resonance is controlled by lateral dimensions of the capacitor. The resonant frequencies of a given capacitor can be estimated by determining the fundamental and harmonic mechanical resonances of the capacitor structure. The resonant frequency of a free standing capacitor is given by $$f_r = \frac{1}{2l\sqrt{pS_{11}}}$$

where l is the lateral dimension of the capacitor p is the density of the ferroelectric and $S_{11}$ is the elastic compliance of the ferroelectric. Mechanical clamping of the capacitor due to it being mounted on a substrate will shift the position of the resonance. Standard methods of calculating these effects however are known. Thus by choosing a capacitor of the right dimensions, the resonant frequency can be varied over a wide range from kHz to GHz. Either the thickness or the lateral dimension of the capacitor can be varied to tune the resonant frequency of the capacitor. By making an array of similar capacitors a device with the desired capacitance can be achieved.

EXAMPLE 2

This example illustrates a capacitor prepared from a substrate on which a blanket conducting electrode is deposited made of a noble metal such as platinum, a ferroelectric layer is deposited on the electrode by a process such as chemical vapor deposition (CVD), physical vapor deposition (PVD), or chemical solution deposition (CSD). Ferroelectric materials with large piezoelectric coefficients such as lead zirconium titanate (PZT) are preferred. A second conducting electrode is deposited on the ferroelectric to form a capacitor stack. The stack is patterned into an array of capacitors by standard lithographic techniques. The lateral dimensions of the capacitors are chosen so that individual capacitors have resonances at the desired frequency/frequencies. The thickness of the ferroelectric and the number of the capacitors are chosen so as to provide the required capacitance per chip (1 nF typical). For PZT, which has a dielectric constant of about 1000 at a film thickness of 200 nm, a total capacitor area of 22600 $\mu m2$ is required per chip. Thus if 10 $\mu m$ square capacitors are used a total of 226 capacitors should be included in the array. The resonant frequency of the capacitors depends on several materials parameters including the elastic properties of the ferroelectric and the surrounding materials and the piezoelectric coefficients of the ferroelectric which in turn depend on the microstructure of the film. Square capacitors should give a few simple resonances. Rectangular capacitors will have several more vibration modes. After etching the capacitors, a dielectric such as $SiO_2$ or boron phosphorus silicate glass (BPSG) is deposited over the capacitors and polished back to the top electrode. A metal layer is then deposited to form common top contact for the capacitor array. The capacitor structure is attached to the chip or chip carrier and electrical contacts are made to the top and bottom capacitor contacts through processes such as wire bond or solder bump attachment.

Various other embodiments or other modifications of the disclosed embodiments will be apparent to those skilled in the art upon reference to this description, or may be made without departing from the spirit and scope of the invention defined in the appended claims. For example, it also is envisioned that capacitor structures pursuant to the present invention could be directly integrated onto a chip by suitable processing.

What is claimed is:

1. A method for configuring a bypass capacitor for use in conjunction with an integrated circuit device, the method comprising:

selecting mechanical dimensions for the bypass capacitor, said mechanical dimensions causing the bypass capacitor to exhibit electrical losses at a clock frequency of the integrated circuit device.

2. The method of claim 1, wherein the bypass capacitor includes a ferroelectric dielectric material.

3. The method of claim 2, wherein said selecting mechanical dimensions for the bypass capacitor determines a mechanical resonance frequency for the bypass capacitor, said mechanical resonance frequency corresponding to said clock frequency.

4. The method of claim 3, wherein:

said selecting mechanical dimensions for the bypass capacitor additionally causes the bypass capacitor to exhibit electrical losses at least one multiple or submultiple of said clock frequency.

5. The method of claim 3, further comprising:

enhancing the magnitude of said electrical losses by increasing mechanical damping properties of said ferroelectric dielectric material.

6. The method of claim 5, wherein said mechanical damping properties of said ferroelectric dielectric material are increased by said ferroelectric dielectric material comprising a perovskite-type oxide selected from:

a titanate system material such as barium titanate, strontium titanate, barium strontium titanate, lead titanate, lead zirconate titanate, lead lanthanum zirconate titanate and barium lanthanum titanate;

a niobate or tantalate system material such as lead magnesium niobate, lithium niobate lithium tantalate, potassium niobate and potassium tantalum niobate;

a tungsten-bronze system material such as barium strontium niobate, lead barium niobate and barium titanium niobate; or a bi-layered perovskite system material such as strontium bismuth tantalate and bismuth titanate.

7. The method of claim 6, wherein said ferroelectric material is a perovskite-type oxide having the formula $ABO_3$, wherein:

B is at least one acid oxide containing a metal selected from Ti, Zr, V, Nb, Ta, Cr, Mo, W, Cu; and A is at least one additional cation having a positive formal charge of from about 1 to about 3.

8. The method of claim 7, wherein said ferroelectric material is a lead zirconium titanate.

9. The method of claim 7, wherein said ferroelectric material is a lead lanthanum zirconium titanate.

10. The method of claim 5, wherein said mechanical damping properties of said ferroelectric dielectric material are increased by embedding the bypass capacitor in a polymer material.

11. The method of claim 5, wherein said mechanical damping properties of said ferroelectric dielectric material are increased by selecting an operating voltage value for the bypass capacitor, said operating voltage value selected to be greater than or less than a value corresponding to a coercive field which demagnetizes said ferroelectric dielectric material.

12. The method of claim 3, wherein:

the bypass capacitor further comprises an array of individual ferroelectric capacitors, connected in parallel;

wherein each of said individual ferroelectric capacitors has an individual mechanical resonance frequency associated therewith, said individual mechanical resonance frequencies corresponding to multiples or submultiples of said clock frequency.

13. The method of claim 3, wherein said mechanical dimensions include a thickness and an area of the bypass capacitor.

* * * * *